(12) United States Patent
Wall

(10) Patent No.: US 7,911,367 B2
(45) Date of Patent: Mar. 22, 2011

(54) METHOD AND CIRCUIT FOR CONVERTING AN N-BIT DIGITAL VALUE INTO AN ANALOG VALUE

(75) Inventor: Graham Wall, Peterborough (CA)

(73) Assignee: Siemens Milltronics Process Instruments, Inc., Peterborough (CA)

( * ) Notice: Subject to any disclaimer, the term of this patent is extended or adjusted under 35 U.S.C. 154(b) by 27 days.

(21) Appl. No.: 12/472,629

(22) Filed: May 27, 2009

(65) Prior Publication Data

US 2009/0295612 A1 Dec. 3, 2009

(30) Foreign Application Priority Data

May 28, 2008 (EP) ..................................... 08009751

(51) Int. Cl.
*H03M 1/66* (2006.01)
(52) U.S. Cl. .......................... 341/144; 341/143; 341/152
(58) Field of Classification Search ........... 341/143–154
See application file for complete search history.

(56) References Cited

U.S. PATENT DOCUMENTS

| | | | | |
|---|---|---|---|---|
| 4,542,371 A | * | 9/1985 | Uchikoshi | 341/152 |
| 5,008,675 A | * | 4/1991 | Toyomaki | 341/152 |
| 6,594,309 B1 | * | 7/2003 | Botti et al. | 375/238 |
| 6,927,715 B2 | * | 8/2005 | Chang et al. | 341/143 |
| 6,965,335 B1 | * | 11/2005 | Trotter et al. | 341/152 |
| 7,221,297 B2 | * | 5/2007 | Ohkuri et al. | 341/120 |
| 7,701,307 B2 | * | 4/2010 | Beale et al. | 332/107 |
| 2002/0041246 A1 | * | 4/2002 | Chang et al. | 341/152 |
| 2005/0157159 A1 | * | 7/2005 | Komiya et al. | 347/237 |
| 2006/0132110 A1 | | 6/2006 | Tang | |
| 2007/0028689 A1 | * | 2/2007 | Vrcelj | 73/514.17 |
| 2009/0185639 A1 | * | 7/2009 | Han et al. | 375/319 |

OTHER PUBLICATIONS

Carosa, T. et al, "Digital Multiphase Modulator—A Power D/A Perspective", Power Electronics Specialists Conference, Jun. 2006, p. 1-6.
Philips Semiconductors, "84C44X; 84C64X; 84C84X 8-bit Microcontrollers with OSD and VST", Nov. 29, 1996, XP 002503910, Retrieved from the Internet: URL:http://www.datasheetarchive.com/pdf-datasheets/Datasheets-25/DSA-491566.html, Retrieved on Nov. 11, 2008, pp. 1-40, figures 10-14, p. 12, col. 2.

* cited by examiner

*Primary Examiner* — Linh V Nguyen

(57) ABSTRACT

A method for converting an N-bit digital value into an analog value is provided. N-M most significant bits of the digital value are converted into a first PWM signal whose period is a multiple of a base time period. M least significant bits of the digital value are converted into a second PWM signal whose period is a $\frac{1}{2}^M$ fraction of the period of the first PWM signal. A third PWM signal is generated by inserting, during the pulse pause of the first PWM signal, the pulse of a selected single period of the second PWM signal into the first PWM signal. Further, the third PWM signal is low-pass filtered.

10 Claims, 1 Drawing Sheet

METHOD AND CIRCUIT FOR CONVERTING AN N-BIT DIGITAL VALUE INTO AN ANALOG VALUE

CROSS REFERENCE TO RELATED APPLICATIONS

This application claims priority of European Patent Application No. 08009751.2 EP filed May 28, 2008, which is incorporated by reference herein in its entirety.

FIELD OF INVENTION

The invention relates to a method for converting an N-bit digital value into an analog value.

It further relates to a corresponding circuit.

BACKGROUND OF INVENTION

It is well known to convert a digital value into an analog value by first converting the digital value into a pulse width modulated (PWM) signal and then low-pass filtering the PWM signal to remove high frequency components, leaving only the low-frequency content.

Further known are PWM controllers having two ore more PWM channels.

SUMMARY OF INVENTION

There is a problem when an N-bit, e.g. 12 bit, digital-to-analog conversion (DAC) is wanted but the PWM controller only offers N-M bit, e.g. 8 bit.

An object of the invention is to provide a high precision DAC conversion by using lower-resolution PWM.

According to the invention, this is achieved by a method and a circuit as claimed in the independent claims.

Preferred embodiments of the method and circuit according to the invention are specified in the remaining claims.

According to the invention, an N-bit digital value is converted into an analog value by:

converting the N-M most significant bits of the digital value into a first PWM signal whose period is a multiple of a base time period, converting the M least significant bits of the digital value into a second PWM signal whose period is a $\frac{1}{2}^M$ fraction of the period of the first PWM signal, generating a third PWM signal by inserting, during the pulse pause of the first PWM signal, the pulse of a selected single period of the second PWM signal into the first PWM signal, and low-pass filtering the third PWM signal.

The first PWM signal provides a coarse DAC, whereas the second PWM signal provides a fine DAC. The output of the fine DAC is used to correct the output of the coarse DAC, thus providing the high-precision third PWM signal which is then low-pass filtered.

The single period of the second PWM signal containing the pulse for fine correcting the coarse pulse of the first PWM signal may be selected by masking the second PWM signal with a mask pulse through an AND gate. The pulse for fine correction may be then simply inserted into the pulse pause of the first, coarse PWM signal by an OR operation of the first PWM signal and the masked second PWM signal.

Normally, a PWM cycle starts with a pulse of variable length followed by a pulse pause. To make it easier to insert the pulse for fine correction into the pulse pause of the first, coarse PWM signal, the N-M most significant bits of the digital value are preferably inverted before they are converted into the first PWM signal, and the first PWM signal is inverted so that the pulse of the first PWM signal is shifted from the beginning to the end of the PWM signal period. This allows generating the mask pulse for selecting the pulse for fine correction synchronously with the beginning of the period of the first PWM signal.

In a preferred embodiment of the invention a 12-bit digital value is converted into an analog value by using two 8-bit PWM signals. In the same way, two 16-bit PWM signals could be used for a 24-bit DAC.

BRIEF DESCRIPTION OF THE DRAWINGS

For further description of the invention, reference is made to the accompanying drawings, in which, by way of example.

DETAILED DESCRIPTION OF INVENTION

Figure 1:
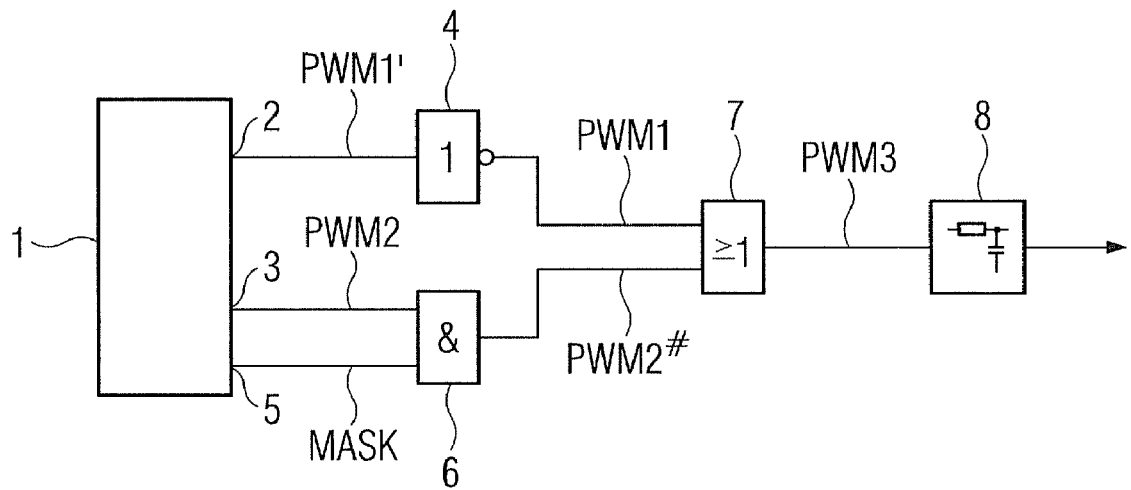
FIG. 1 is a simplified schematic diagram of a circuit for converting a digital value into an analog value.

Referring to FIG. 1, a PWM controller 1 comprises a first 8-bit PWM signal output 2 providing an intermediate first 8-bit PWM signal PWM1', and a second 8-bit PWM signal output 3 providing a second 8-bit PWM signal PWM2. It is intended to convert a digital 12-bit value into a corresponding analog value. Thus, an N-bit DAC, here 12-bit DAC, is wanted but the PWM controller 1 only offers N-M bit, here 12−4 bit=8 bit.

For example, the circuit shown in FIG. 1 is part of an industrial 4-20 mA process device which shall output a value of 8.102 mA. Thus, the digital value to be converted to analog is [(8.102 mA−4 mA)/(20 mA−4 mA)]·$2^{12}$=1050=010000011010.

Figure 2:
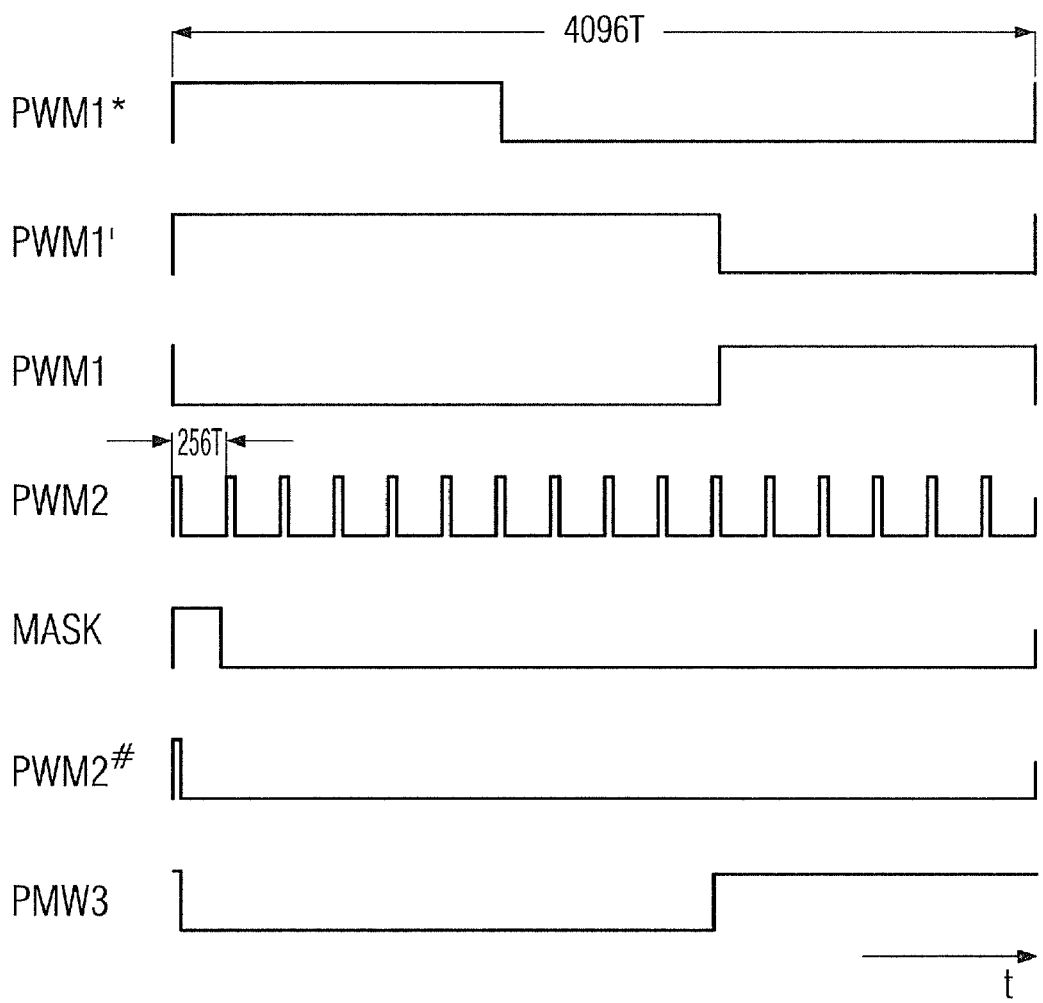
FIG. 2 shows a timing diagram of signals in the circuit of FIG. 1.

As shown in FIG. 2, the intermediate first 8-bit PWM signal PWM1' has a period of $2^{12}$ T=4096 T, where T is a base time period (clock) provided by a timer of the PWM controller 1. The resolution of the first 8-bit PWM signal PWM1 is then ($2^{12}$ T)/$2^8$=16 T.

The period of the second 8-bit PWM signal PWM2 is set to a $\frac{1}{2}^M=\frac{1}{2}^4$ fraction of the period of the first PWM signal, i.e. $2^8$ T=256 T. Thus, the resolution of the second 8-bit PWM signal PWM2 is ($2^8$ T)/$2^8$=1 T.

If the N−M=12−4=8 most significant bits of the digital value, i.e. 01000001, are PWM converted, one would obtain a PWM signal PWM1*, as shown at the top of FIG. 2. There, the pulse starts at the beginning of the PWM period (cycle) and is followed by a pulse pause at the end of the PWM cycle. To shift the pulse from the beginning to the end of the pulse cycle, the 8 most significant bits of the digital value, i.e. 01000001, are first inverted to 10111110 before they are converted into the intermediate first PWM signal PWM1'. The intermediate first PWM signal PWM1' is then inverted by means of an inverter (NOT gate) 4 to a first PWM signal PWM1.

The remaining M=4 least significant bits of the digital value, i.e. 1010, are converted into the second PWM signal PWM2. The PWM controller 1 further generates at an output 5 a mask pulse MASK at the beginning of each cycle of the first PWM signal PWM1. The length of the mask pulse MASK is equal to the period of the second PWM signal PWM2. Through an AND gate 6, the second PWM signal PWM2 is masked with the mask pulse MASK to select the pulse of the first period of the second PWM signal PWM2 during the period of the first PWM signal PWM1. That means that the selected pulse of the second PWM signal PWM2 coincide with the beginning of the pulse pause of the first PWM signal PWM1.

The first PWM signal PWM1 and the masked second PWM signal PWM2$^{\#}$ are fed to an OR gate to generate a third PWM signal PWM3 which is then low-pass filtered by a low-pass filter 8 to obtain the wanted analog value.

If the PWM signal PWM* is used instead of PWM1, the mask pulse must be generated at the end of the cycle of the PWM signal PWM*. In this case, the NOT gate 4 is not needed.

The invention claimed is:

1. A method of converting an N-bit digital value into an analog value, comprising:
    converting N-M most significant bits of the digital value into a first PWM signal whose period is a multiple of a base time period;
    converting M least significant bits of the digital value into a second PWM signal whose period is a $\frac{1}{2}^M$ fraction of the period of the first PWM signal;
    generating a third PWM signal by inserting, during the pulse pause of the first PWM signal, the pulse of a selected single period of the second PWM signal into the first PWM signal; and
    low-pass filtering the third PWM signal.

2. The method according to claim 1, wherein a single period of the second PWM signal is selected by masking the second PWM signal with a mask pulse.

3. The method according to claim 2, wherein the pulse of the selected single period of the second PWM signal is inserted into the first PWM signal by an OR operation of the first PWM signal and the masked second PWM signal.

4. The method according to claim 1, wherein the N-M most significant bits of the digital value are inverted before they are converted into an intermediate first PWM signal and wherein the intermediate first PWM signal is inverted so that the pulse of the first PWM signal is at the end of its period.

5. The method according to claim 4, wherein the selected single period of the second PWM signal is the first one during the period of the first PWM signal.

6. The method according to claim 1, wherein N=8 and M=4.

7. A circuit for converting an N-bit digital value into an analog value, comprising:
    a PWM controller configured to
        convert N-M most significant bits of the digital value into a first PWM signal whose period is a multiple of a base time period,
        convert M least significant bits of the digital value into a second PWM signal whose period is a $\frac{1}{2}^M$ fraction of the period of the first PWM signal, and
        generate a mask pulse during the pulse pause of the first PWM signal, the length of the mask pulse corresponding to the period of the second PWM signal;
    an AND gate configured to mask the second PWM signal with said mask pulse;
    an OR gate configured to generate a third PWM signal from the first PWM signal and the masked second PWM signal; and
    a low-pass filter configured to low-pass filter the third PWM signal.

8. The circuit according to claim 7, wherein the PWM controller is further configured to invert the N-M most significant bits of the digital value before they are converted into an intermediate first PWM signal.

9. The circuit according to claim 8, further comprising:
    an inverter configured to invert the intermediate first PWM signal, the inverter being arranged between the PWM controller and the OR gate.

10. The circuit according to claim 8, wherein the PWM controller is further configured to generate the mask pulse synchronously with the beginning of the period of the first PWM signal.

* * * * *